(12) United States Patent
Takai et al.

(10) Patent No.: US 7,749,612 B2
(45) Date of Patent: *Jul. 6, 2010

(54) RESIN COATED METAL FOIL, METAL CLAD LAMINATE, PRINTED WIRING BOARD USING THEM, AND MANUFACTURING METHOD THEREOF

(75) Inventors: Kenji Takai, Oyama (JP); Takayuki Sueyoshi, Kodaira (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/173,900

(22) Filed: Jul. 16, 2008

(65) Prior Publication Data

US 2008/0277143 A1 Nov. 13, 2008

Related U.S. Application Data

(62) Division of application No. 10/506,529, filed as application No. PCT/JP03/02572 on Mar. 5, 2003, now Pat. No. 7,473,458.

(30) Foreign Application Priority Data

| Mar. 5, 2002 | (JP) | ............................. 2002-058162 |
| Mar. 28, 2002 | (JP) | ............................. 2002-091885 |
| May 10, 2002 | (JP) | ............................. 2002-136052 |

(51) Int. Cl.
  *H05K 9/00* (2006.01)
  *H05K 1/02* (2006.01)

(52) U.S. Cl. ....................... 428/612; 428/447; 428/448; 428/450; 428/687; 174/259

(58) Field of Classification Search ................. 428/209, 428/612, 901, 447–450, 687; 174/259
See application file for complete search history.

(56) References Cited

U.S. PATENT DOCUMENTS

| 6,254,971 B1 | 7/2001 | Katayose et al. |
| 6,329,074 B1 | 12/2001 | Fujiwara et al. |
| 6,451,441 B1 * | 9/2002 | Nishimoto et al. .......... 428/461 |

(Continued)

FOREIGN PATENT DOCUMENTS

CN  1260684  7/2000

(Continued)

OTHER PUBLICATIONS

Korean Official Action issued Jun. 7, 2008, for Application No. 10-2006-001547.

(Continued)

*Primary Examiner*—Cathy Lam
(74) *Attorney, Agent, or Firm*—Antonelli, Terry, Stout & Kraus, LLP.

(57) ABSTRACT

The present invention provides a metal clad laminate or a resin coated metal foil having a metal foil whose both surfaces are not substantially roughening-treated and an insulating resin composition layer using generally used insulating resin, and a printed wiring board and a manufacturing method thereof, in which the metal clad laminate or the resin coated metal foil is used, the reliability and circuit formability are high, and the conductor loss is extremely low.

12 Claims, 5 Drawing Sheets

U.S. PATENT DOCUMENTS

2008/0011612 A1    1/2008  Takai et al.

FOREIGN PATENT DOCUMENTS

| | | |
|---|---|---|
| EP | 0957664 | 11/1999 |
| JP | 07-170064 | 7/1995 |
| JP | 08-193188 | 7/1996 |
| JP | 10-231424 | 9/1998 |
| JP | 11-10794 | 1/1999 |
| JP | 11-124550 | 5/1999 |
| JP | 11-135942 | 5/1999 |
| JP | 11-140275 | 5/1999 |
| JP | 10-256724 | 9/1999 |
| JP | 11-317574 | 11/1999 |
| JP | 2000-165037 | 6/2000 |
| JP | 2000-269637 | 9/2000 |
| JP | 2000-286531 | 10/2000 |
| JP | 2001-089892 | 4/2001 |
| JP | 2001-140090 | 5/2001 |
| JP | 2001-1203464 | 7/2001 |
| JP | 2003-229648 | 8/2003 |
| JP | 2005-053218 | 3/2005 |
| KR | 1997-0021155 | 5/1997 |
| KR | 1998-064561 | 10/1998 |
| KR | 1998-071471 | 10/1998 |
| KR | 2000-0016429 | 3/2000 |
| KR | 2000-0047764 | 7/2000 |
| KR | 10-0280911 | 11/2000 |
| KR | 2001-0080264 | 8/2001 |
| WO | WO 97/47165 | 12/1997 |
| WO | WO 01/19606 | 3/2001 |
| WO | WO 2005/009093 | 1/2005 |

OTHER PUBLICATIONS

Written Opposition to the Grant of Patent, issued Dec. 19, 2007, for KR 10-2006-001547, with English translation.
Japanese Official Action, for Application No. 2002-020288, dated Nov. 14, 2006, with English translation.
Korean Official Action, issued Jan. 27, 2006, for KR 10-2004-7013826, with English translation.
Korean Official Action issued Apr. 28, 2008, for Application No. 10-2007-7014453.
Korean Official Action issued Apr. 28, 2008, for Application No. 10-2007-7014454.
Korean Official Action issued Apr. 28, 2008, for Application No. 10-2007-7014455.
Korean Official Action issued Apr. 28, 2008, for Application No. 10-2007-7014456.
Korean Office Action issued on Mar. 23, 2009; Application No. 10-2007-7014453.
Korean Office Action issued on Mar. 23, 2009; Application No. 10-2007-7014455.
Korean Official Action issued May 13, 2008, for Application No. 10-2007-7010301.
Korean Official Action issued Nov. 24, 2008, for Application No. 10-2008-7023803.
Japanese Decision for Rejection issued Jun. 23, 2009, for Application No. 2006-251671.
Korean Notice of the Amendment Dismissal in Korea issued Apr. 14, 2009, for Application No. 10-2006-7010301.
Korean Official Action issued Sep. 29, 2009, for Application No. 10-2007-7014455.
Chinese Official Action dated Aug. 21, 2009, for Application No. 2006101018027.

* cited by examiner

L/S=30/30 μm

L/S=25/25 μm

L/S=20/20 μm

L/S=30/30 μm

L/S=25/25 μm

L/S=20/20 μm

RESIN COATED METAL FOIL, METAL CLAD LAMINATE, PRINTED WIRING BOARD USING THEM, AND MANUFACTURING METHOD THEREOF

This application is a Divisional application of application Ser. No. 10/506,529, filed (371(c) date) Jan. 31, 2005 now U.S. Pat. No. 7,473,458, the contents of which are incorporated herein by reference in their entirety. No. 10/506,529 is a National Stage Application under 35 USC 371 of International (PCT) Application No. PCT/JP03/02572, filed Mar. 5, 2003.

TECHNICAL FIELD

The present invention relates to resin coated metal foil, a metal clad laminate, a printed wiring board using them, and a manufacturing method thereof. Particularly the invention relates to a technology suitable for the printed wiring board in which a conductor circuit is formed through pattern electroplating, in which metal foil of the metal clad laminate formed by fixing the metal foil onto an insulating resin composition is used as an electric power supply layer.

BACKGROUND ART

Recently, as demand for miniaturization, weight reduction, and speeding-up of electronic equipment is increased, density growth of the printed wiring board is in progress, and the printed wiring board manufacturing method by a semi-additive process using electroplating receives widespread attention. As described in Japanese Patent Application Laid-Open No. 11-186716, the semi-additive process is a technique in which, after a hole which becomes an interstitial via hole (hereinafter referred to as IVH) is formed by laser or the like in a resin surface on which the circuit is to be formed, an irregularity having roughness of several micrometers is formed by chemical roughening or plasma treatment or the like, on the resin, a Pd catalyst is given, electroless plating having a thickness of about 1 µm is performed, a pattern electroplating resist is formed, a circuit is formed by pattern electroplating, and the resist and the electric power supply layer existing in portions except for the circuit are removed. Compared with a subtractive process that performs large side etching, the semi-additive process allows finer wiring to be formed.

There is also a method in which the circuit is formed on the resin coated metal foil by the semi-additive process. Recently, as described in Japanese Patent Application Laid-Open No. 13-140090 or Japanese Patent Application Laid-Open No. 13-89892, a peelable type metal foil is used in order to decrease a thickness of the metal foil. In the peelable type metal foil, the metal foil having the thickness not more than 5 µm is formed on a support metal foil. In this technique, it is not necessary to perform the electroless plating to the surface of an insulating resin composition layer, so that the printed wiring board having higher reliability can be produced.

In the case where the circuit is formed on the resin coated metal foil by the semi-additive process, as the thinner metal foil becomes more advantageous to the formation of the fine wiring. However, in practice, as described in Japanese Patent No. 2927968, a roughened layer having the thickness of several micrometers for obtaining given peel strength between the metal foil and a resin cured material is provided in the metal foil, which obstructs thinning of the metal foil. In the semi-additive process, it is necessary that the electric power supply layer existing in portions except for the circuit is removed by etching after the electroplating. Because of the irregularity existing in the roughened layer, an etching residue easy to generate, which causes short-circuit failure. Further, because the irregularity of the roughened layer increases electric resistance of a conductor circuit, transmission loss becomes larger. It is known that this increase in electric resistance becomes prominent as a signal is transmitted with higher frequency. When the roughened layer exists in the metal foil, excessive etching is required in forming the conductor circuit, and a conductor top width is narrowed compared to its bottom width, therefore it is not possible to obtain a favorable and fine circuit.

In order to solve the above-described problems, Japanese Patent Application Laid-Open No. 8-309918 discloses a copper clad laminate in which copper foil to which the roughening treatment is not performed and a peroxide curing resin composition which becomes the insulating layer are laminated through a adhesion substrate including a silane coupling agent or a thiol coupling agent. In accordance with the Application, various problems caused by the roughening treatment of the metal foil can be solved without decreasing the peel strength between the copper foil and the insulating layer.

However, in the above-described method, it is necessary to use the peroxide curing resin as the insulating layer. In this case, there is a fear that the reliability of the printed wiring board manufactured with the copper clad laminate including the peroxide curing resin is decreased. Additionally, since the peroxide curing resin itself is potentially hazardous material, handling and retention the material are very difficult and, furthermore, the material is coastlines compared with the insulating resins usually used, so that it is not said that the peroxide curing resin is practical.

SUMMARY OF THE INVENTION

It is an object of the invention to provide a metal clad laminate or a resin coated metal foil in which adhesion is compatible with flatness at an interface between an insulating resin composition layer and metal foil and practical factors such as cost efficiency and handling are satisfied in manufacturing a printed wiring board. Further, it is another object of the invention to provide the printed wiring board and the manufacturing method thereof, in which the metal clad laminate or the resin coated metal foil is used, the reliability and circuit formability are high, and conductor loss is extremely low.

That is to say, the invention relates to the following descriptions (1) to (40).

(1) A resin coated metal foil including an insulating resin composition layer and metal foil fixed to a single surface or both the surfaces of the insulating resin composition layer, wherein the resin coated metal foil characterized in that surface treatment is performed to at least an insulating resin composition layer side of the metal foil and roughening treatment is not substantially performed to both the surfaces of the metal foil.

(2) The resin coated metal foil according to (1), characterized in that surface roughness (Rz) of the metal foil is not more than 2.0 µm in both the surfaces.

(3) The resin coated metal foil according to (1) or (2), characterized in that a thickness of the metal foil is not more than 3 µm.

(4) The resin coated metal foil according to any one of (1) to (3), characterized in that interfacial roughness (Rz) between the insulating resin composition layer and the metal foil is not more than 2.0 μm.

(5) The resin coated metal foil according to any one of (1) to (4), characterized in that the surface treatment is any one of anti-corrosive treatment, chromate treatment, and silane coupling treatment or a combination thereof.

(6) The resin coated metal foil according to (5), characterized in that the anti-corrosive treatment is performed with any one of nickel, tin, zinc, chromium, molybdenum, and cobalt or alloy thereof.

(7) The resin coated metal foil according to (5) or (6), characterized in that the insulating resin composition contains cyanate resin and the anti-corrosive treatment is performed with a metal mainly containing nickel.

(8) The resin coated metal foil according to any one of (5) to (7), characterized in that the chromate treatment is performed on the anti-corrosive treatment.

(9) The resin coated metal foil according to any one of (5) to (8), characterized in that the silane coupling treatment is performed to an outermost layer of the metal foil.

(10) The resin coated metal foil according to any one of (5) to (9), characterized in that a silane coupling agent used for the silane coupling treatment chemically reacts with the insulating resin composition by heating.

(11) The resin coated metal foil according to any one of (5) to (10), characterized in that the insulating resin composition contains epoxy resin and the silane coupling agent used for the silane coupling treatment contains amino functional silane.

(12) The resin coated metal foil according to any one of (1) to (11), characterized in that the insulating resin composition contains thermosetting resin.

(13) The resin coated metal foil according to any one of (1) to (12), characterized in that the insulating resin composition contains epoxy resin which is liquid at room temperatures.

(14) The resin coated metal foil according to any one of (1) to (13), characterized in that the insulating resin composition contains a latent curing agent.

(15) The resin coated metal foil according to any one of (1) to (14), characterized in that, in the post-cure insulating resin composition, a relative dielectric constant is not more than 3.0 at 1 GHz or a dielectric loss tangent is not more than 0.01 at 1 GHz.

(16) A metal clad laminate including an insulating resin composition layer and metal foil fixed to a single surface or both the surfaces of the insulating resin composition layer, wherein the metal clad laminate characterized in that surface treatment is performed to at least an insulating resin composition layer side of the metal foil and roughening treatment is not substantially performed to both the surfaces of the metal foil.

(17) The metal clad laminate according to (16), characterized in that surface roughness (Rz) of the metal foil is not more than 2.0 μm in both the surfaces.

(18) The metal clad laminate according to (16) or (17), characterized in that a thickness of the metal foil is not more than 3 μm.

(19) The metal clad laminate according to any one of (16) to (18), characterized in that interfacial roughness (Rz) between the insulating resin composition layer and the metal foil is not more than 2.0 μm.

(20) The metal clad laminate according to any one of (16) to (19), characterized in that the surface treatment is any one of anti-corrosive treatment, chromate treatment, and silane coupling treatment or a combination thereof.

(21) The metal clad laminate according to (20), characterized in that the anti-corrosive treatment is performed with any one of nickel, tin, zinc, chromium, molybdenum, and cobalt or alloy thereof.

(22) The metal clad laminate according to (20) or (21), characterized in that the insulating resin composition contains cyanate resin and the anti-corrosive treatment is performed with a metal mainly containing nickel.

(23) The metal clad laminate according to any one of (20) to (22), characterized in that the chromate treatment is performed on the anti-corrosive treatment.

(24) The metal clad laminate according to any one of (20) to (23), characterized in that the silane coupling treatment is performed to an outermost layer of the metal foil.

(25) The metal clad laminate according to any one of (20) to (24), characterized in that a silane coupling agent used for the silane coupling treatment chemically reacts with the insulating resin composition by heating.

(26) The metal clad laminate according to any one of (20) to (25), characterized in that the insulating resin composition contains epoxy resin and the silane coupling agent used for the silane coupling treatment contains amino functional silane.

(27) The metal clad laminate according to any one of (16) to (26), characterized in that the insulating resin composition contains thermosetting resin.

(28) The metal clad laminate according to any one of (16) to (27), characterized in that the insulating resin composition contains epoxy resin which is liquid at room temperatures.

(29) The metal clad laminate according to any one of (16) to (28), characterized in that the insulating resin composition contains a latent curing agent.

(30) The metal clad laminate according to any one of (16) to (29), characterized in that, in the post-cure insulating resin composition, a relative dielectric constant is not more than 3.0 at 1 GHz or a dielectric loss tangent is not more than 0.01 at 1 GHz.

(31) The printed wiring board characterized by being manufactured with resin coated metal foil according to any one of (1) to (15) and/or a metal clad laminate according to any one of (16) to (30).

(32) The printed wiring board according to (31), characterized in that surface roughness (Rz) of a conductor circuit is not more than 2.0 μm.

(33) The printed wiring board according to (31) or (32), characterized in that peel strength between the insulating resin composition layer and a conductor circuit having a width of 1 mm is not lower than 0.6 kN/m.

(34) The printed wiring board according to any one of (31) to (33), characterized in that the peel strength between the insulating resin composition layer, which has been heated at 150°

C. for 240 hours, and the conductor circuit having the width of 1 mm is not lower than 0.4 kN/m.

(35) A method of manufacturing a printed wiring board, characterized by having a process of producing a conductor circuit through pattern electroplating in which resin coated metal foil according to any one of (1) to (15) and/or metal foil of a metal clad laminate according to any one of (16) to (30) is used as an electric power supply layer.

(36) The printed wiring board manufacturing method according to (35), characterized in that an electroless plating layer is formed on the metal foil.

(37) The printed wiring board manufacturing method according to (35) or (36), characterized in that chemical reaction rate-determining etchant is used when the metal foil which a is a the electric power supply layer is removed by etching after formation of the conductor circuit.

(38) The printed wiring board manufacturing method according to (37), characterized in that the etchant mainly contains an acid which does not contain a halogen element, and hydrogen peroxide.

(39) The printed wiring board manufacturing method according to (38), characterized in that the acid which does not contain the halogen element is sulfuric acid.

(40) The printed wiring board manufacturing method according to (39), characterized in that concentrations of the sulfuric acid range from 5 to 300 g/L and concentrations of the hydrogen peroxide range 5 to 200 g/L.

This application is based on and claims the benefit of priority from the prior Japanese Patent Applications (JP-A) applied by the same applicant, namely JP-A No. 2002-58162 (filed Mar. 5, 2002), JP-A No. 2002-91885 (filed Mar. 28, 2002), and JP-A No. 2002-136052 (filed May 10, 2002), the entire contents of which are incorporated herein by reference.

PREFERRED MODE FOR CARRYING OUT THE INVENTION

Figure 1:
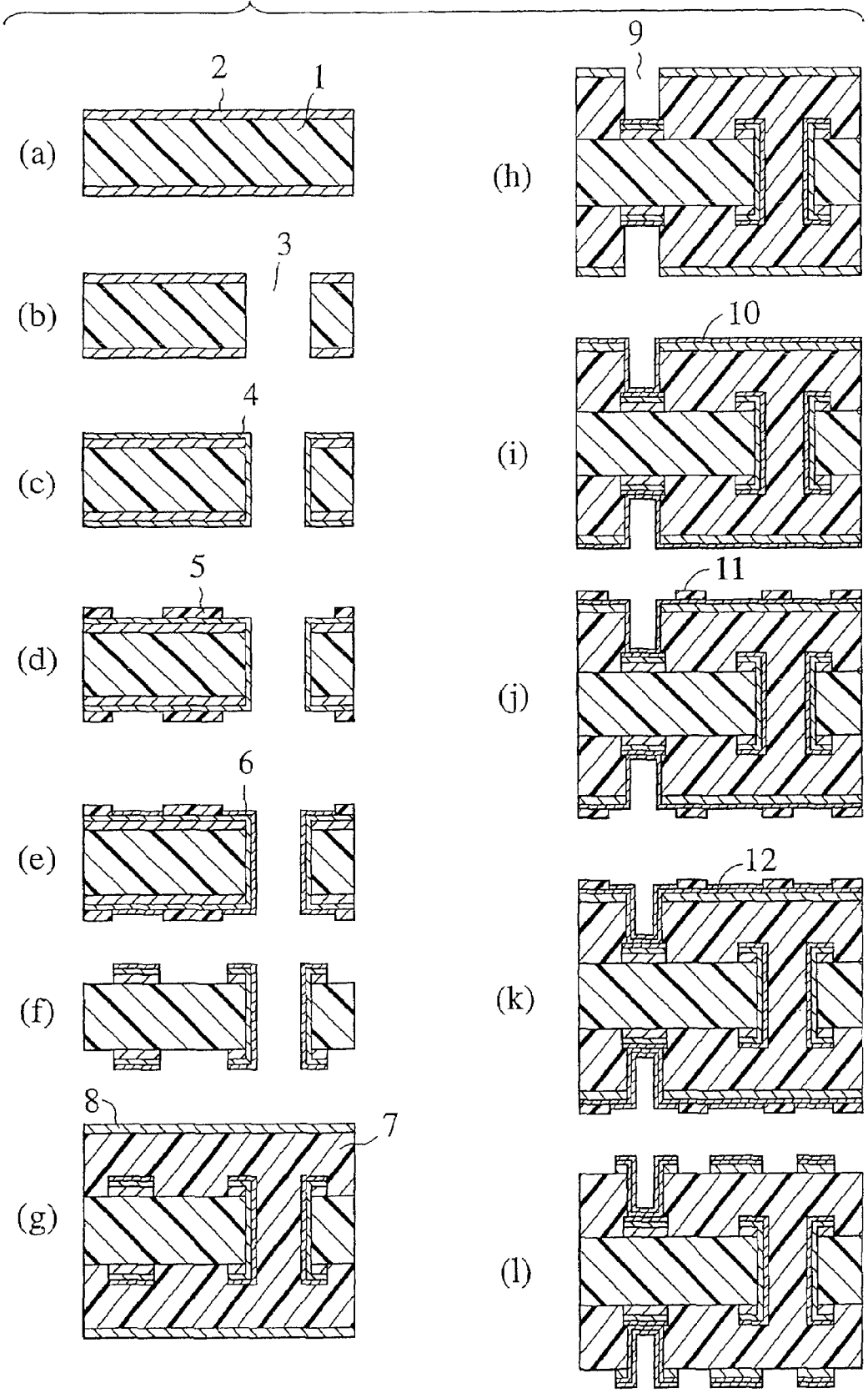
FIG. 1 is a sectional view showing an example of a method of manufacturing a printed wiring board by using a metal clad laminate of the invention.

The metal clad laminate and the resin coated metal foil of the invention will be described in detail below.

As shown in FIG. 1A, for example, the metal clad laminate of the invention is the metal clad laminate in which metal foils 2, which roughening treatment is not substantially performed, are integrally laminated on the both sides of a prepreg 1.

The prepreg is formed by the method in which varnish of an insulating resin composition is impregnated into a base material or the base material is coated with the varnish. A well-known base material used in various laminated plates for an electric insulating material can be used as the base material for the prepreg. Inorganic fiber such as E glass, D glass, S glass, or Q glass, organic fiber such as polyimide, polyester, or tetrafluoroethylene, and a mixture thereof can be cited as an example of the base material. Theses base materials have a shape such as woven fabric, non-woven fabric, roving, a chopped strand mat, and a surfacing mat. The material and the shape are selected by application or performance of the target of laminated product and, as needed, it is possible to use one or more materials and shapes. Although the thickness of the base material is not particularly limited, the base material having the thickness of 0.03 to 0.5 mm is usually used. The base material in which surface treatment is performed with a silane coupling agent or the like, and the base material in which opening treatment is mechanically performed are preferable from viewpoints of heat resistance, humidity resistance, and workability. The prepreg can be obtained, such that the resin is impregnated into the base material or the base material is coated with the resin so that resin contents range 20 to 90% by weight, and the base material is heated and dried at temperatures of 100 to 200° C. for 1 to 30 minutes to make the resin a semi-cured state (B stage state). Then, the 1 to 20 prepregs are usually stacked on one another, the two pieces of metal foil are arranged on both the surfaces of the stacked prepregs, and the metal foil and the stacked prepregs are laminated by heating and pressuring. Accordingly, the metal clad laminate described in the invention can be obtained. Although the thickness of the plurality of prepregs depends on the application, usually it is preferable that the thickness ranges from 0.1 to 5 mm. A general laminate technique can be applied to the laminating method. For example, the lamination can be performed by using a multistage press, a multiple vacuum press, a continuous molding machine, an autoclave molding machine, or the like on conditions that temperatures range from 100 to 250° C., pressures range 0.2 to 10 MPa, and heating time ranges 0.1 to 5 hours, or the lamination can be performed by using a vacuum laminating device or the like on conditions that temperatures range from 50 to 150° C., pressures range 0.1 to 5 MPa, and vacuum pressures range 1.0 to 760 mmHg.

A well-known general insulating resin used as the printed wiring board can be used as the insulating resin used for the insulating resin composition of the invention. Usually the thermosetting resin having good heat resistance and chemical resistance is used as a base. Phenolic resin, epoxy resin, cyanate resin, maleimide resin, isocyanate resin, benzocyclobutene resin, and vinyl resin can be cited as an example of the thermosetting resin. However, the invention is not limited to these resins. It is possible to use one type of the thermosetting resin solely or at a mixed resin of least two types of the thermosetting resin.

Among the above-described thermosetting resins, the epoxy resin has excellent heat resistance, chemical resistance, and electrical properties and epoxy is relatively low cost. Therefore, the epoxy resin is widely used, as the insulating resin and it is particularly important. Bisphenol type epoxy resin such as bisphenol A type epoxy resin, bisphenol F type epoxy resin, and bisphenol S type epoxy resin, novolac type epoxy resin such as phenol novolac type epoxy resin, cresol novolac type epoxy resin, and bisphenol A novolac type epoxy resin, cycloaliphatic epoxy resin, aliphatic chain epoxy resin, a biphenol diglycidyl etherified compound, a naphthalenediol diglycidyl etherified, a phenol diglycidyl etherified compound, an alcohol diglycidyl etherified compound, and alkyl derivative substitution, halides, and hydrogenations of these compounds can be cited as an example of the epoxy resin. It is possible that one type of epoxy resin is solely used or at least two types of epoxy resins are mixed to use. With reference to a curing agent used with epoxy resin, the curing agent can be used with no limitation as long as the curing agent can cure epoxy resin. For example, multifunctional phenol, multifunctional alcohol, amine, an isodazole compound, acid anhydride, an organic phosphide compound, and halide of these materials can be cited as an example of the curing agent. It is possible that one type of the epoxy resin curing agent is solely used or at least two types of the epoxy resin curing agents are mixed to use.

The cyanate resin generates a curing material having a repetition unit of a triazine ring by heating. Because the curing material of the cyanate resin has excellent dielectric properties, often the cyanate resin is used in the case where high frequency properties are particularly required. 2,2-bis(4-cyanatophenyl)propane, bis(4-cyanatophenyl)ethane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropyl benzene, and phenol novolac cyanate esterified compound and alkyl phenol novolac cyanate esterified compound can be cited as an example of the cyanate resin. Among them, 2,2-bis(4-cyanatophenyl)propane is preferable, because 2,2-bis(4-cyanatophenyl)propane has particularly good balance between the dielectric properties and curing properties of the curing material and is low cost. For the cyanate resin, which is used in the invention, it can be used one type of the cyanate resin solely or a mixed resin of at least two types of the cyanate resins, and also can be oligomerized in a trimer or a pentamer.

A curing catalyst or a curing accelerator can be added to the cyanate resin. Metals such as manganese, iron, cobalt, nickel, copper, and zinc are used as the curing catalyst, specifically, these metals are used as organic metal salt such as 2-ethyl hexanoate, naphthenate, and octylate and organometallic complex such as acetylacetone complex. It is possible that one type of the organic metal salt or the organometallic complex is solely used or at least two types of the organic metal salts or organometallic complexes are mixed to use. It is preferable that phenol is used as the curing accelerator, monofunctional phenol such as nonyl phenol and paracumyl phenol, bifunctional phenol such as bisphenol A, bisphenol F, and bisphenol S, or multi-functional phenol such as phenol novolac and cresol novolac can be used as the curing accelerator. It is possible that one type of the curing accelerator is solely used or at least two types of the curing accelerators are mixed to use.

In consideration of the dielectric properties, shock resistance, film workability, and the like, thermoplastic resin can be added to the insulating resin composition used in the invention. Fluorocarbon resin, polyphenylene ether, denatured polyphenylene ether, polyphenylene sulfide, polycarbonate, polyetherimide, polyether ketone, polyalylate, polyamide, polyamidoimide, and polybutadiene can be cited as an example of the thermoplastic resin. However, the invention is not limited to the above-described thermoplastic resins. It is possible that one type of the thermoplastic resin is solely used or at least two types of the thermoplastic resin are mixed to use.

Among the above-described thermoplastic resins, polyphenylene ether and denatured polyphenylene ether are useful because these ethers improves the dielectric properties of the curing material. Poly(2,6-dimethyl-1,4-phenylene) ether, aroylation polymer of poly(2,6-dimethyl-1,4-phenylene)ether and polystyrene, aroylation polymer of poly(2,6-dimethyl-1,4-phenylene)ether and styrene-butadiene copolymer, aroylation polymer of poly(2,6-dimethyl-1,4-phenylene)ether and styrene-maleric anhydride copolymer, aroylation polymer of poly(2,6-dimethyl-1,4-phenylene) ether and polyamide, aroylation polymer of poly(2,6-dimethyl-1,4-phenylene)ether and styrene-butadiene-acrylonitrile copolymer can be cites as an example of polyphenylene ether and denatured polyphenylene ether. In order to impart reactivity and polymerization properties to polyphenylene ether, it is possible that a functional group such as an amino group, an epoxy group, carboxyl group, a styryl group, and methacryl group is introduced to a terminal of a polymer chain, or it is possible that functional group such as an amino group, an epoxy group, carboxyl group, a styryl group, and methacryl group is introduced to a side chain of a polymer chain.

Among the above-described thermoplastic resins, the polyamidoimide resin is useful because it has good adhesion to the metal in addition to the excellent heat resistance and humidity resistance. In a raw material of polyamidoimide, trimellitate anhydride, and trimellitate anhydride monochloride can be cited as an acid component, and metaphenylenediamine, paraphenylenediamine, 4,4'-diaminodiphenyl ether, 4,4'-diaminodiphenyl methane, bis[4-(aminophenoxy)phenyl]sulfone, 2,2'-bis[4-(4-aminophenoxy)phenyl]propane can be cited as an amine component. However, the invention is not limited these materials. In order to improve drying properties, it is also possible to use siloxane denaturation. In this case, siloxane diamine is used as the amino component. In consideration of the film workability, it is preferable to use the material having a molecular weight not lower than 50000.

In the insulating resin composition used in the invention, inorganic filler can be mixed. Alumina, aluminum hydroxide, magnesium hydroxide, clay, talc, antimony trioxide, antimony pentaoxide, zinc oxide, fused silica, glass powder, quartz powder, sirasu balloon can be cited as an example of the inorganic filler. It is possible that one type of the inorganic filler is solely used or at least two types of the inorganic fillers are mixed to use.

It is possible that the insulating resin composition used in the invention contains an organic solvent. An aromatic hydrocarbons solvent such as benzene, toluene, xylene and trimethyl benzene; a ketones solvent such as acetone, methylethylketone, and methylisobutylketone; an ethers solvent such as tetrahydrofuran; an alcohols solvent such as isopropanol and butanol; an ether alcohols solvent such as 2-methoxyethanol and 2-buthoxyethanol; an amide solvent such as N-methylpyrrolidone, N,N-dimethylformxamide, and N,N-dimethylacetamide can be cited as an example of the organic solvent. It is possible that one type of the organic solvent is solely used or at least two types of the organic solvents are mixed to use. It is preferable that for the amount of solvent in the varnish of the insulating resin composition used for the production of the prepreg and the like to range from 40 to 80% by weight. It is preferable for the viscosity of the varnish of the insulating resin composition to range from 20 to 100 cP at 25° C.

It is possible that fire retardant is mixed in the insulating resin composition used in the invention. As is well known in the art, a brome compound such as decabromophenyl ether, tertabromobisphenol A, tetrabromo phthalic anhydride, and tribromophenol, a phosphorus compound such as triphenyl phosphate, tricresyl phosphate, trixylyl phosphate, cresyl diphenyl phosphate, metal hydroxide such as magnesium hydroxide and aluminum hydroxide, red phosphorous and its denaturated material, and an antimony compound such as antimony trioxide and antimony pentaoxide, and triazine compound such as melamine, cyanuric acid, and melamine cyanuric acid can be used as the fire retardant additive.

It is possible that various addition agents such as the curing agent, the curing accelerator, thermoplastic power, a coloring agent, an ultraviolet impermeable agent, an anti-oxidizing agent, and reducing agent and the filler can be added to the insulating resin composition used in the invention.

When the insulating resin composition in which a relative dielectric constant is not more than 3.0 at 1 GHz after the curing or a dielectric loss tangent is not more than 0.01 at 1 GHZ after the curing is used as the insulating resin composition used in the invention, since a decrease in dielectric loss in the wiring can be realized, the circuit having smaller transmission loss can be formed. Polyphenylene ether resin and cyanate resin can be cited as an example of the resin having the good dielectric properties. In the case where polyphenylene ether is used for the printed wiring board, it is necessary to impart the thermosetting property in order to improve the heat resistance and chemical resistance. The method of blending the thermosetting resin such as epoxy resin, cyanate resin, and triazine-bismaleimide resin in polyphenylene ether, or the method of introducing a polymerization functional group such as a double bond and an epoxy group in a molecular chain of polyphenylene ether can be cited as a method of imparting the thermosetting property to polyphenylene ether.

In the metal foil used in the invention, roughening treatment such as formation of a nodular electro-deposit layer (so-called burning plating: Japanese Patent Application Laid-Open No. 8-21618), oxidation treatment, reduction treatment and etching is not substantially performed to its surface. The word of "substantially" means that the metal foil to which the roughening treatment is performed to the extent that the sufficient peel strength is not obtained can be also used, and preferably the metal foil to which the roughening treatment is not performed at all is used. Accordingly, in the surface roughness of the metal foil used in the invention, it is preferable that ten-point average roughness (Rz) shown in JIS B0601 is not more than 2.0 µm in both the surfaces, it is more preferable that the average roughness (Rz) is not more than 1.5 µm, and it is particularly preferable that roughness (Rz) is not more than 1.0 µm.

For example, copper foil, nickel foil, and aluminum foil can be used as the metal foil used in the invention. However, usually the copper foil is used as the metal foil. The method of manufacturing the copper foil used in the invention is not particularly limited. For example, in the case where the peelable type copper foil having a carrier is manufactured, metal oxide or organic layer which becomes a peel layer is formed on carrier foil having the thicknesses of 10 to 50 µm, and the copper foil can be manufactured on conditions that concentrations of sulfuric acid ranges from 50 to 100 g/L, concentrations of copper ranges from 30 to 100 g/L, liquid temperatures ranges from 20° C. to 80° C., and current density ranges from 0.5 to 100 A/dm$^2$ when a copper sulfate bath is used, or on conditions that concentrations of potassium pyrophosphate ranges from 100 to 700 g/L, concentrations of copper ranges from 10 to 50 g/L, liquid temperatures ranges from 30° C. to 60° C., pH ranges from 8 to 12, and current density ranges from 1 to 10 A/dm$^2$ when a copper pyrophosphate bath is used. Some times various addition agents are added to the bath in consideration of physical properties and smoothness of the copper foil. The peelable type metal foil has the carrier, and the carrier can be peeled.

Although the thickness of the metal foil used in the invention is not particularly limited, it is preferable that the thickness is not more than 3 µm. In the case where the peelable type copper foil having the carrier is used, it is preferable that the thickness of the metal foil becomes not more than 3 µm after the carrier is peeled. In the case where such metal foil is used as the electric power supply layer, the printed wiring board having good wiring formability can be obtained as described later.

In order to increase the adhesion between the metal foil and the insulating resin compound layer to the practical level or better, the surface treatment is performed at least onto the insulating resin composition layer side of the metal foil used in the invention. Any one of the anti-corrosive treatment, the chromate treatment, and the silane coupling treatment or varying combinations thereof can be cited as an example of the surface treatment to the metal foil. It is preferable that the type of the surface treatment is properly studied in accordance with the resin used for the insulating resin composition layer.

The anti-corrosive treatment can be performed by forming a thin film made of the metal such as nickel, tin, zinc, chromium molybdenum, and cobalt or the alloy of these metals on the metal foil by sputtering, the electroplating, and the electroless plating. From viewpoint of cost, electroplating is preferable. In order to easily deposit a metallic ion, it is possible to add requirement of a complexing agent such as citrate, tartrate, and sulfamate. Usually plating solution is used in an acid range, the electroplating is performed at temperatures ranging room temperature to 80° C. The electroplating is usually performed on conditions that current density ranges from 0.1 to 10 A/dm$^2$, current-applying time ranges 1 to 60 seconds, and it is preferable that the current-applying time is properly selected from the range of 1 to 30 seconds. Though the amount of metal used in the anti-corrosive treatment depends on the type of metal, the preferable amount of metal is in the range of 10 to 2000 µg/dm$^2$ in total. When the anti-corrosive treatment becomes too thick, etching inhibition and the decrease in electrical properties are generated. When the anti-corrosive treatment becomes too thin, the decrease in peel strength between the resin and the metal foil is generated.

In the case where the insulating resin compound contains the cyanate resin, it is preferable that the anti-corrosive treatment is performed with the metal containing nickel. This combination is useful because the decrease in peel strength is small in a heat-resistance aging test or humidity-resistance aging test.

An aqueous solution containing a hexavalent chromium ion is preferably used for the chromate treatment. Although the chromate treatment can be simply performed by dipping treatment, it is preferable that the chromate treatment is performed by cathode treatment. It is preferable that the cathode treatment is performed on conditions that concentrations of sodium bichromate range from 0.1 to 50 g/L, pH ranges from 1 to 13, bath temperatures range 0 to 60° C., current density ranges 0.1 to 5 A/dm$^2$, and electrolysis time ranges 0.1 to 100 seconds. It is also possible that chromic acid or potassium bichromate is used for the chromate treatment instead of sodium bichromate. It is preferable that the chromante treatment is performed onto the anti-corrosive treatment, which allows the adhesion between the insulating resin composition and the metal foil to be further improved.

For example, epoxy functional silane such as 3-glycidoxypropyl trimethoxysilane and 2-(3,4-epoxycyclohexyl)ethyl trimethoxysilane, amino functional silane such as 3-aminopropyl trimethoxysilane, N-2-(aminoethyl)-3-aminopropyl dimethoxysilane, and N-2-(aminoethyl)-3-aminopropylmethyl dimethoxysilane, olefin functional silane such as vinyl trimethoxysilane, vinylphenyl trimethoxysilane, and vinyl tris(2-methoxyethoxy)silane, acryl functional silane such as 3-acryloxypropyl trimethoxysilane, methacryl functional silane such as 3-methacryloxypropyl trimethoxysilane, and mercapto functional silane such as 3-mercaptopropyl trimethoxysilane can be used as the silane coupling agent used for the silane coupling treatment. It is possible that one type of these materials is solely used or at least two types of these materials are mixed to use. The silane coupling agent dissolves in the solvent such as water with concentrations ranging 0.1 to 15 g/L, and the silane coupling agent is absorbed by applying the silane coupling agent to the metal foil at temperatures ranging from room temperature to 50° C. or by the electro-deposition. The silane coupling agent forms a film by condensed bonding between the silane coupling agent and a hydroxyl group of the anti-corrosive treatment metal on the metal foil surface. After the silane coupling treatment, stable bonding is formed by the heating or ultraviolet irradiation. In the case of the heating, the drying is performed for 2 to 60 seconds at temperatures of 100 to 200° C. In the case of the ultraviolet irradiation, the ultraviolet irradiation is performed in the range from 200 to 2500 mJ/cm$^2$ on condition that wavelengths range from 200 to 400 nm. It is also preferable that silane coupling treatment is performed onto the outermost layer of the metal foil.

Further, for the silane coupling agent used for the silane coupling treatment, it is preferable that the silane coupling agent chemically reacts with the insulating resin composition by the heating to temperatures ranging from 60 to 200° C., and it is more preferable that the chemical reaction is performed by the heating to temperatures ranging from 80 to 150° C. Therefore, the functional group in the insulating resin composition can react with the functional group of the silane coupling agent to obtain the excellent adhesion. For example, it is preferable that the silane coupling agent containing the amino functional silane is used for the insulating resin composition containing the epoxy group. This is because that the strong chemical bonding is easily formed by the epoxy group and the amino group with the heat and the bonding is extremely stable for the heat and moisture. Epoxy group-amino group, epoxy group-epoxy group, epoxy group-mercapto group, epoxy group-hydroxyl group, epoxy group-carboxyl group, epoxy group-cyanato group, amino group-hydroxyl group, amino group-carboxyl group, and amino group-cyanato group can be cited as an example of the combination forming the chemical bonding.

It is preferable to use the epoxy resin which is liquid at room temperatures as the insulating resin of the insulating resin composition. In this case, because the viscosity is largely decreased in fusing, wetting properties are improved at the adhesion interface, and the chemical reaction of the epoxy resin and the silane coupling agent becomes easy to occur, which results in the high peel strength. Specifically, bisphenol A type epoxy resin, bisphenol F type epoxy resin, and phenol novolac type epoxy resin which have epoxy equivalent of about 200 are preferable.

In the case where the insulating resin composition contains the curing agent, it is possible to use a thermosetting type latent curing agent. Namely, in the case where the functional group in the insulating resin composition and the functional group of the silane coupling agent chemically react with each other, it is preferable that the curing agent is selected so that the reaction temperature of the functional group in the insulating resin composition and the functional group of the silane coupling agent is lower than the temperature in which curing reaction of the insulating resin composition is started. Therefore, the reaction between the functional group in the insulating resin composition and the functional group of the silane coupling agent preferentially and selectively occurs, and adhesion between the metal foil and the insulating resin composition is further increased. A solid dispersion-heating fused type curing agent such as dicyandiamide, a dihydrazid compound, an imidazole compound, and amine-epoxy adduct and reactive group block type curing agent such as omium salts, boron trichloride/amine salts, and a block carboxylic compound can be cited as an example of the thermosetting type latent curing agent for the insulating resin composition containing the epoxy resin.

The metal clad laminate of the invention shown in FIG. 1A can be obtained such that the prepreg containing the above-described insulating resin composition and the metal foil in which the roughening treatment is not substantially performed to the surface and the above-described surface treatment is performed are laminated and integrated by the method.

The resin coated metal foil of the invention can be obtained by applying the varnish of the above-described insulating resin composition on the above-described metal foil and heating and drying it. The application can be performed by the applying method such as a kiss coater, a roller coater, and a comma coater. It is preferable that the heating and drying are performed at temperatures ranging from 100 to 200° C. for 1 to 30 minutes. In the insulating resin composition after the heating and drying, it is preferable that the amount of residual solvent ranges from about 0.2% to about 10%. In the case where the resin coated metal foil is produced, it is preferable that the mount of solvent ranges from 30 to 70% by weight in the varnish of the insulating resin composition, and it is preferable that the viscosity of the varnish ranges from 100 to 500 cP at 25° C. The resin coated metal foil of the invention can be also formed by laminating the film insulating resin composition onto the metal foil. In this case, it is appropriate that the resin film is laminated on the metal foil on conditions that temperatures range from 50 to 150° C. and pressures ranges from 0.1 to 5 Mpa.

In the invention, it is preferable that the interfacial roughness (Rz) between the metal clad laminate or the insulating resin composition layer of the resin coated metal foil and metal foil is not more than 2.0. It is more preferable that the interfacial roughness (Rz) is not more than 1.5 µm. In the invention, the interfacial roughness between the insulating resin composition layer and the metal foil is the numerical value measured by the method in which the metal clad laminate, the resin coated metal foil, or the conductor metal of the printed wiring board is etched and the roughness of the exposed resin surface is measured pursuant to JIS-B-0601.

Then, an example of the method of manufacturing the printed wiring board by using the metal clad laminate of the invention obtained by the above-described manner will be described.

At first, a through hole 3 for interlayer connection is formed in the metal clad laminate of FIG. 1($a$), and catalyst nuclei are given to the surfaces of the metal foil 2 and the inside of the through hole 3 (FIG. 1($b$)). When a diameter of the through hole is not lower than 100 µm, drilling is preferable to the formation of the through hole 3. When a diameter of the through hole is not more than 100 µm, gas lasers such as a $CO_2$ laser, a CO laser, and an excimer laser or solid-state lasers such as a YAG laser is preferable to the formation of the through hole 3. The catalyst nuclei are given with a noble metal ion or palladium colloid.

Then, as shown in FIG. 1($c$), a thin electroless plating layer 4 is formed on the surfaces of the metal foil 2 and the inside of the through hole 3 in which catalyst nuclei are given. Commercially available electroless copper plating such as CUST2000 (trade name, product of Hitachi Chemical Co., Ltd.) and CUST201 (trade name, product of Hitachi Chemical Co., Ltd.) can be used for the electroless plating. The electroless copper plating mainly contains copper sulfate, formalin, the complexing agent, and sodium hydroxide. The thickness of the plating is not limited as long as the thickness is suitable to the electro-plating which is next process. It is sufficient that the thickness ranges from 0.1 to 1 μm.

Then, as shown in FIG. 1(d), a plating resist 5 is formed on the electroless plating. It is preferable that the thickness of the plating resist is similar to or more than larger that of the conductor which is plated later. A liquid resist such as PMER P-LA900PM (trade name, product of Tokyo Ohka Kogyo Co., Ltd.) or a dry film such as HW-425 (trade name, product of Hitachi Chemical Co., Ltd.) and RY-3025 (trade name, product of Hitachi Chemical Co., Ltd.) can be cited as the resin used for the plating resist. The plating resist is not formed at positions where a via hole and the conductor circuit are formed.

Then, as shown in FIG. 1(e), a circuit pattern 6 is formed by electroplating. Copper sulfate electroplating used usually for the printed wiring board can be used for the electroplating. The thickness of the plating is not limited as long as the thickness can be used as the conductor circuit. It is preferable that the thickness ranges from 1 to 100 μm. It is more preferable that the thickness ranges from 5 to 50 μm.

Then, the resist is removed using an alkaline stripping agent, sulfuric acid, or a commercially available resist stripping agent, and the copper except for pattern portions is removed by the etching (FIG. 1(f)). The etchant used in the invention is not particularly limited. However, in the case where the conventional diffusion controlled etchant is used, since liquid exchange becomes worse in a fine pattern portion of the wiring, circuit formability tends to be worsened. Therefore, it is desirable not to use the etchant whose reaction with the copper is the diffusion control, but to use the etchant whose reaction proceeds with the reaction control. When the reaction of the copper and the etchant is reaction control, etching rate is not changed even if the diffusion is accelerated and more. Namely, there is generated no difference in etching rates in the place where the liquid exchange is good and the place where the liquid exchange is bad. The etchant which mainly contains hydrogen peroxide and the acid not containing the halogen element can be cited as an example of the reaction controlled etchant. Since the hydrogen peroxide is used as oxidizing agent, the etching rate can be strictly controlled by managing the concentration of the hydrogen peroxide. When the halogen element is mixed in the etchant, the dissolving reaction tends to be diffusion control. Although nitric acid, sulfuric acid, organic acid, and the like can be used as the acid not containing the halogen element, the sulfuric acid is preferable because it is not expensive. Further, in the case where the etchant mainly contains the sulfuric acid and the hydrogen peroxide, from viewpoints of the etching rate and the etchant stability, it is concentrations of the sulfuric acid range from 5 to 300 g/L and concentrations of the hydrogen peroxide range from 5 to 200 g/L.

A one-side metal clad laminate or the resin coated metal foil is laminated onto both the sides of the substrate of FIG. 1(f) which is an internal circuit substrate (FIG. 1(g)). In this case, it is preferable that the one-side metal clad laminate or resin coated metal foil, which is used in the step of FIG. 1F, is similar to the metal clad laminate or resin coated metal foil of the invention. It is preferable that the thickness of an insulating layer 7 ranges from 10 to 100 μm, and it is more preferable that the thickness ranges from 20 to 60 μm. It is preferable that the thickness of metal foil 8 ranges from 0.3 to 3 μm.

Then, as shown in FIG. 1(h), after IVH 9 is formed into the insulating layer 7 from the metal foil 8, a resin residue inside IVH 9 is removed. The use of the laser is preferable to the method of forming IVH. The gas lasers such as the $CO_2$ laser, the CO laser, and the excimer laser or the solid-state lasers such as the YAG laser can be used for making the IVH. The $CO_2$ laser is preferable to the formation of IVH having the diameter not lower than 50 μm, because the $CO_2$ laser easily obtains large output. In the case where the fine IVH having the diameter not more than 50 μm is formed, the YAG laser is preferable because the YAG laser has the shorter wavelength and better focusing properties. Permanganate, chromate, chromic acid, and the like can be cited as an example of the oxidizing agent used for the removal of the resin residue.

Then, the catalyst nuclei are given to the surfaces of the metal foil 8 and the insides of IVH 9, and a thin electroless plating layer 10 is formed on the surfaces of the metal foil 8 and the insides of IVH 9. The commercially available electroless copper plating such as CUST2000 (trade name, product of Hitachi Chemical Co., Ltd.) and CUST201 (trade name, product of Hitachi Chemical Co., Ltd.) can be used for the electroless plating. The electroless copper plating mainly contains copper sulfate, formalin, the complexing agent, and sodium hydroxide. The thickness of the plating is not limited as long as the thickness is suitable to the electro-plating which is a next process. It is sufficient that the thickness ranges from 0.1 to 1 μm.

Then, as shown in FIG. 1(j), a plating resist 11 is formed on the electroless plating layer 10. It is preferable that the thickness of the plating resist is similar to or more than larger that of the conductor which is plated later. The liquid resist such as PMER P-LA900PM (trade name, product of Tokyo Ohka Kogyo Co., Ltd.) or the dry film such as HW-425 (trade name, product of Hitachi Chemical Co., Ltd.) and RY-3025 (trade name, product of Hitachi Chemical Co., Ltd.) can be cited as the resin used for the plating resist. The plating resist is not formed at positions where the via hole and the conductor circuit are formed.

Then, as shown in FIG. 1(k), a circuit pattern 12 is formed by electroplating. The copper sulfate electroplating used usually for the printed wiring board can be used for the electroplating. The thickness of the plating is not limited as long as the thickness can be used as the conductor circuit. It is preferable that the thickness ranges from 1 to 100 μm. It is more preferable that the thickness ranges from 5 to 50 μm.

Then, A conductor circuit is formed by removing the resist using the alkaline stripping agent, the sulfuric acid, or the commercially available resist stripping agent, and etching the copper except for the conductor circuit pattern portions with the etchant which is the above-mentioned etchant of reaction control preferably (FIG. 1(l)).

Further, it is possible that gold plating is performed on the conductor circuit of the substrate of FIG. 1(l). The conventional well-known methods can be used for the gold plating method and the gold plating method is not particularly limited. For example, there is the method in which activation treatment of the conductor interface is performed with an activation treatment agent such as SA-100 (trade name, product of Hitachi Chemical Co., Ltd.), the electroless nickel plating such as NIPS-100 (trade name, product of Hitachi Chemical Co., Ltd.) is performed with the thickness ranging from 1 to 10 μm, displacement gold plating such as HGS-100 (trade name, product of Hitachi Chemical Co., Ltd.) is performed with the thickness ranging from 0.01 to 0.1 μm, and then electroless gold plating such as HGS-2000 (trade name, product of Hitachi Chemical Co., Ltd.) is performed with the thickness ranging from 0.1 to 1 μm.

As described above, it is possible to provide the printed wiring board and the manufacturing method thereof, in which the reliability and the circuit formability are excellent and conductor loss is very small, by using the metal clad laminate of the invention or by using the resin coated metal foil with the metal clad laminate depending on conditions. Needless to say, it is possible that the printed wiring board of the invention is manufactured only by using the resin coated metal foil. Since the adhesion between the insulating resin composition layer and the metal foil which becomes the conductor circuit also sufficiently satisfies the practical value, there are few failures caused by line peel in the process of manufacturing the printed wiring board. In the printed wiring board of the invention, it is preferable that the peel strength between the insulating resin composition layer and the conductor circuit having the width of 1 mm is not lower than 0.6 kN/m, and it is more preferable that the peel strength is not lower than 0.8 kN/m. Further, after the printed wiring board is heated at 150° C. for 240 hours, it is preferable that the peel strength between the insulating resin composition layer and the conductor circuit having the width of 1 mm is not lower than 0.4 kN/m, and it is more preferable that the peel strength is not lower than 0.6 kN/m.

The invention will be described in more detail below by examples, however, the invention is not limited to the examples.

(Production of Metal Foil 1)

A chrome plating layer (peel layer) having the thickness of 1.0 mg/dm$^2$ was formed by continuously performing chrome plating to a glossy surface of electrolytic copper foil (carrier copper foil) having the width of 510 mm and the thickness of 35 μm on the following conditions. The surface roughness Rz was 0.5 μm after the formation of the chrome plating. The surface roughness was measured pursuant to JIS-B-0601.

Chrome Plating Conditions

Solution composition: chromium trioxide 250 g/L, sulfuric acid 2.5 g/L
Bath temperature: 25° C.
Anode: lead
Current density: 20 A/dm$^2$ Then, electrolytic copper plating was performed on bright electroplating conditions shown below. The metal foil surface roughness Rz was 0.6 μm after the electrolytic copper plating was finished.

Copper Sulfate Plating Conditions

Solution composition: copper sulfate 5 hydrate 100 g/L, sulfuric acid 150 g/L, chloride ion 30 ppm
Bath temperature: 25° C.
Anode: lead
Current density: 10 A/dm$^2$ Then, the zinc anti-corrosive treatment was performed by electroplating as shown below.

Solution composition: zinc 20 g/L, sulfuric acid 70 g/L
Bath temperature: 40° C.
Anode: lead
Current density: 15 A/dm$^2$
Electrolysis time: 10 seconds Then, the chromate treatment shown below was performed.

Solution composition: chromic acid 5.0 g/L
pH: 11.5
Bath temperature: 55° C.
Anode: lead
Dipping time: 5 seconds Then, the silane coupling treatment shown below was performed.

Solution composition: 3-aminopropyl trimethoxysilane 5.0 g/L
Bath temperature: 25° C.
Dipping time: 10 seconds After the silane coupling treatment, the metal foil was dried at 120° C. to cause the coupling agent to be absorbed onto the surface of the metal foil. At that time, the metal foil surface roughness Rz was 0.6 μm.

(Production of Metal Foil 2)

The metal foil was produced in a manner similar to the metal foil 1 except that the anti-corrosive treatment was performed by the electrolytic nickel plating instead of the zinc anti-corrosive treatment of the metal foil 1. At that time, the metal foil surface roughness Rz was 0.6 μm.

Electrolytic Nickel Plating

Solution composition: zinc 20 g/L, sulfuric acid 70 g/L
Bath temperature: 40° C.
Anode: lead
Current density: 15 A/dm$^2$
Electrolysis time: 10 seconds (Production of Metal Foil 3)

The metal foil was produced in a manner similar to the metal foil 1 except that the γ-glycidoxypropyl trimethoxysilane was used instead of the silane coupling agent used in the case of the metal foil 1. At that time, the metal foil surface roughness Rz was 0.6 μm.

(Production of Metal Foil 4)

The metal foil was produced in a manner similar to the metal foil 2 except that the γ-glycidoxypropyl trimethoxysilane was used instead of the silane coupling agent used in the case of the metal foil 2. At that time, the metal foil surface roughness Rz was 0.6 μm.

(Production of Metal Foil 5)

The metal foil was produced in a manner similar to the metal foil 1 except that the chromate treatment of the metal foil 1 was not performed. At that time, the metal foil surface roughness Rz was 0.6 μm.

(Production of Metal Foil 6)

The metal foil was produced in a manner similar to the metal foil 1 except that the silane coupling treatment of the metal foil 1 was not performed. At that time, the metal foil surface roughness Rz was 0.6 μm.

(Production of Metal Foil 7)

The metal foil was produced similar to the metal foil 1 except that the zinc anti-corrosive treatment of the metal foil 1 was not performed. At that time, the metal foil surface roughness Rz was 0.6 μm.

(Production of Metal Foil 8)

The metal foil was produced in a manner similar to the metal foil 1 except that the electrolytic copper plating having the thickness of 2.0 μm was performed on the following burning plating conditions after bright copper electroplating. At that time, the metal foil surface roughness Rz was 2.7 μm.

Burning Plating Conditions

Solution composition: copper sulfate 5 hydrate 50 g/L, sulfuric acid 100 g/L, chloride ion 30 ppm Bath temperature: 25° C.

Anode: lead

Current density: 10 A/dm$^2$ (Production of Insulating Resin Composition 1)

Bisphenol A type epoxy resin which is in a liquid condition at normal temperature (trade name: Epikote 828EL, product of Yuka Shell Co., Ltd.) 30% by weight, cresol novolac type epoxy resin (trade name: Epiclon N-500, product of Dainippon Ink and Chamicals, Incorporated) 30% by weight, and bromination bisphenol A type epoxy resin (trade name: YDB-500, product of Tohto Kasei Co., Ltd.) 30% by weight were heated and dissolved at 80° C. while stirred in the methyl ethyl ketone, and then 2,4-diamino-6-(2-methyl-1-imidasolyl ethyl)-1,3,5-triazine/isocyanuric acid adduct 4% by weight which is the latent epoxy curing agent, fine grinding silica 2% by weight, and antimony trioxide 4% by weight were added to produced epoxy insulating resin composition varnish.

(Production of Insulating Resin Composition 2)

Polyphenylene ether resin (trade name: PKN 4752, product of GE plastics Co., Ltd.) 20% by weight, 2,2-bis(4-cyanatophenyl) propane (trade name: ArocyB-10, product of Asahi Ciba Co., Ltd.) 40% by weight, a phosphorized phenol compound (trade name: HCA-HQ, product of Sanko Chemical Co., Ltd.) 8% by weight, manganese naphthenate (manganese content=6% by weight, Nihon Kagaku Sangyo Co., Ltd.) 0.1% by weight, 2,2-bis(4-glycidylphenyl)propane (trade name: DER331L, product of Dow chemical Japan Limited) 32% by weight were heated and dissolved in toluene at 80° C. to produce polyphenylene ether-cyanate insulating resin composition varnish.

(Production of Insulating Resin Composition 3)

Siloxane denaturated polyamidoimide resin (trade name: KS-6600, product of Hitachi Chemical Co., Ltd.) 80% by weight and cresol novolac type epoxy resin (trade name: YDCN-703, product of TOHTO KASEI CO., LTD.) 20% by weight were dissolved in NMP (N-methylpyrrolidone) at 80° C. to produce siloxane denaturated polyamidoimide insulating resin composition varnish.

EXAMPLE 1

Figure 2:
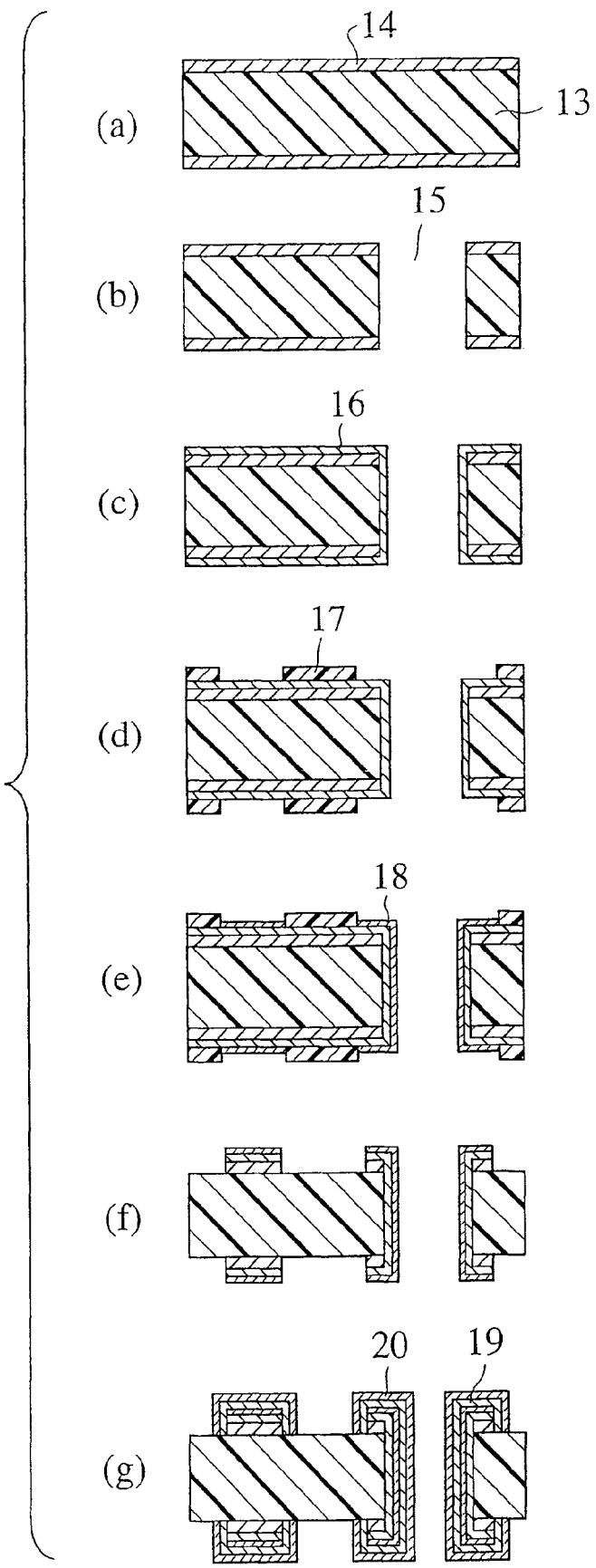
FIG. 2 is a sectional view showing a method of manufacturing the board used for evaluation of EXAMPLE 1 to EXAMPLE 15 and COMPARATIVE EXAMPLE 1.

The varnish of the insulating resin composition 1 was impregnated into glass cloth (basic weight 210 g/m$^2$) having the thickness of 0.2 mm and dried at 120° C. for 5 minutes to obtain the prepreg. The four prepregs and two pieces of the metal foil 1 were laminated while each one piece of the metal foil 1 was located at the top and the bottom. The prepreg and the metal foil were press-formed for one hour on the conditions of 170° C. and 2.45 MPa, and the carrier copper foil was peeled to manufacture the copper clad laminate including an insulating layer 13 and copper foil 14 as shown in FIG. 2(a).

As shown in FIG. 2(b), a through hole 15 having the diameter of 80 µm was made from above the metal foil with a carbon dioxide gas impact laser punching machine L-500 (product name, Sumitomo Heavy Industries, Ltd.), and a smear was removed by dipping the copper clad laminate into mixed aqueous solution of potassium permanganate of 65 g/L and sodium hydroxide of 40 g/L at a solution temperature of 70° C. for 20 minutes.

Then, after the copper clad laminate was dipped into HS-202B (tradename, product of Hitachi Chemical Con, Ltd.) which is a palladium solution at 25° C. for 15 minutes and the catalyst was given, the electroless copper plating was performed with CUST-201 (trade name, product of Hitachi Chemical Co., Ltd.) on the conditions of the solution temperature of 25° C. for 30 minutes to form an electroless copper plating layer 16 having the thickness of 0.3 µm as shown in FIG. 2(c).

As shown in FIG. 2(d), RY-3025 (trade name, product of Hitachi Chemical Co., Ltd.) which is a dry film photoresist was laminated on the surface of the electroless plating layer 16, and RY-3025 was exposed with ultraviolet ray through a photomask which masks the portions where the electrolytic copper plating is performed. Then development was performed to form a plating resist 17.

As shown in FIG. 2(e), the electrolytic copper plating was performed up to 20 µm with the copper sulfate bath on the conditions that the solution temperature was 25° C. and the current density was 1.0 A/dm$^2$, and a pattern electrolytic copper plating 18 was formed so that a minimum circuit conductor width/circuit conductor interval (L/S) became 25/15 µm.

Then, as shown in FIG. 2(f), after the dry film was removed with HTO (trade name, product of Nichigo-Morton Co., Ltd.) which is a resist stripping solution, the copper except for the copper located on the pattern portions was removed by the etching with the etchant having the composition of $H_2SO_4$ 20 g/L and $H_2O_2$ 10 g/L. At the time of etching, after the substrate was cut into small pieces whose surface area of one side was 1 dm$^2$, the small pieces are put into a 1 L beaker and etching was performed with a magnetic stirrer at 40° C. for 5 minutes.

Finally, a nickel plating layer 19 and a gold plating layer 20 were formed on the conductor circuit on the conditions shown in TABLE 1 (FIG. 2(g)). After the formation of the circuit, the minimum circuit conductor width/circuit conductor interval (L/S) was 20/20 µm (bottom width).

TABLE 1

| Gold plating conditions | | |
|---|---|---|
| Activation treatment | SA-100 | RT 5 minutes |
| Electroless nickel plating | NIPS-100 | 85° C. 20 minutes (Thickness 3 µm) |
| Rinsing | Pure water | RT 1 minute |
| Displacement gold plating | HGS-100 | 85° C. 10 minutes (Thickness 0.02 µm) |
| Displacement gold plating | HGS-2000 | 65° C. 40 minutes (Thickness 0.5 µm) |

EXAMPLE 2

The varnish of the insulating resin composition 1 was impregnated into glass cloth (basic weight 210 g/m$^2$) having the thickness of 0.2 mm and dried at 120° C. for 5 minutes to obtain the prepreg. The substrate was produced in a manner similar to EXAMPLE 1 except that the four prepregs and two pieces of the metal foil 2 were laminated while each one piece of the metal foil 2 was located at the top and the bottom and press-formed for one hour on the conditions of 170° C. and 2.45 MPa to manufacture the copper clad laminate shown in FIG. 2(a).

EXAMPLE 3

The varnish of the insulating resin composition 2 was impregnated into glass cloth (basic weight 210 g/m$^2$) having the thickness of 0.2 mm and dried at 160° C. for 5 minutes to obtain the prepreg. The substrate was produced in a manner similar to EXAMPLE 1 except that the four prepregs and two pieces of the metal foil 2 were laminated while each one piece of the metal foil 2 was located at the top and the bottom and press-formed for one hour on the conditions of 170° C. and 2.45 MPa to manufacture the copper clad laminate shown in FIG. 2(a).

EXAMPLE 4

The varnish of the insulating resin composition 2 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 4 were laminated while each one piece of the metal foil 4 was located at the top and the bottom and press-formed for one hour on the conditions of 170° C. and 2.45 MPa to manufacture the copper clad laminate shown in FIG. 2(a).

EXAMPLE 5

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 1 were laminated while each one piece of the metal foil 1 was located at the top and the bottom and press-formed for one hour on the conditions of 170° C. and 2.45 MPa to manufacture the copper clad laminate shown in FIG. 2(a).

EXAMPLE 6

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 2 were laminated while each one piece of the metal foil 2 was located at the top and the bottom and press-formed for one hour on the conditions of 170° C. and 2.45 MPa to manufacture the copper clad laminate shown in FIG. 2(a).

EXAMPLE 7

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 3 were laminated while each one piece of the metal foil 3 was located at the top and the bottom and press-formed for one hour on the conditions of 170° C. and 2.45 MPa to manufacture the copper clad laminate shown in FIG. 2(a).

EXAMPLE 8

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 4 were laminated while each one piece of the metal foil 4 was located at the top and the bottom and press-formed for one hour on the conditions of 170° C. and 2.45 MPa to manufacture the copper clad laminate shown in FIG. 2(a).

EXAMPLE 9

The varnish of the insulating resin composition 1 was impregnated into glass cloth (basic weight 210 g/m²) having the thickness of 0.2 mm and dried at 120° C. for 5 minutes to obtain the prepreg. The substrate was produced in a manner similar to EXAMPLE 1 except that the four prepregs and two pieces of the metal foil 3 were laminated while each one piece of the metal foil 3 was located at the top and the bottom and press-formed for one hour on the conditions of 170° C. and 2.45 MPa to manufacture the copper clad laminate shown in FIG. 2(a).

EXAMPLE 10

The varnish of the insulating resin composition 1 was impregnated into glass cloth (basic weight 210 g/m²) having the thickness of 0.2 mm and dried at 120° C. for 5 minutes to obtain the prepreg. The substrate was produced in a manner similar to EXAMPLE 1 except that the four prepregs and two pieces of the metal foil 4 were laminated while each one piece of the metal foil 4 was located at the top and the bottom and press-formed for one hour on the conditions of 170° C. and 2.45 MPa to manufacture the copper clad laminate shown in FIG. 2(a).

EXAMPLE 11

The varnish of the insulating resin composition 2 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 1 were laminated while each one piece of the metal foil 1 was located at the top and the bottom and press-formed for one hour on the conditions of 170° C. and 2.45 MPa to manufacture the copper clad laminate shown in FIG. 2(a).

EXAMPLE 12

The varnish of the insulating resin composition 2 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 3 were laminated while each one piece of the metal foil 3 was located at the top and the bottom and press-formed for one hour on the conditions of 170° C. and 2.45 MPa to manufacture the copper clad laminate shown in FIG. 2(a).

EXAMPLE 13

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 5 were laminated while each one piece of the metal foil 5 was located at the top and the bottom and press-formed for one hour on the conditions of 170° C. and 2.45 MPa to manufacture the copper clad laminate shown in FIG. 2(a).

EXAMPLE 14

The varnish of the insulating resin composition 3 was impregnated into glass cloth (basic weight 210 g/m²) having the thickness of 0.2 mm and dried at 160° C. for 5 minutes to obtain the prepreg. The substrate was produced in a manner similar to EXAMPLE 1 except that the four prepregs and two pieces of the metal foil 6 were laminated while each one piece of the metal foil 6 was located at the top and the bottom and press-formed for one hour on the conditions of 170° C. and 2.45 MPa to manufacture the copper clad laminate shown in FIG. 2(*a*).

EXAMPLE 15

The varnish of the insulating resin composition 3 was impregnated into glass cloth (basic weight 210 g/m$^2$) having the thickness of 0.2 mm and dried at 160° C. for 5 minutes to obtain the prepreg. The substrate was produced in a manner similar to EXAMPLE 1 except that the four prepregs and two pieces of the metal foil 7 were laminated while each one piece of the metal foil 7 was located at the top and the bottom and press-formed for one hour on the conditions of 170° C. and 2.45 MPa to manufacture the copper clad laminate shown in FIG. 2(*a*).

COMPARATIVE EXAMPLE 1

The substrate was produced in a manner similar to EXAMPLE 1 except that the metal foil 8 was used.

EXAMPLE 16

Figure 3:
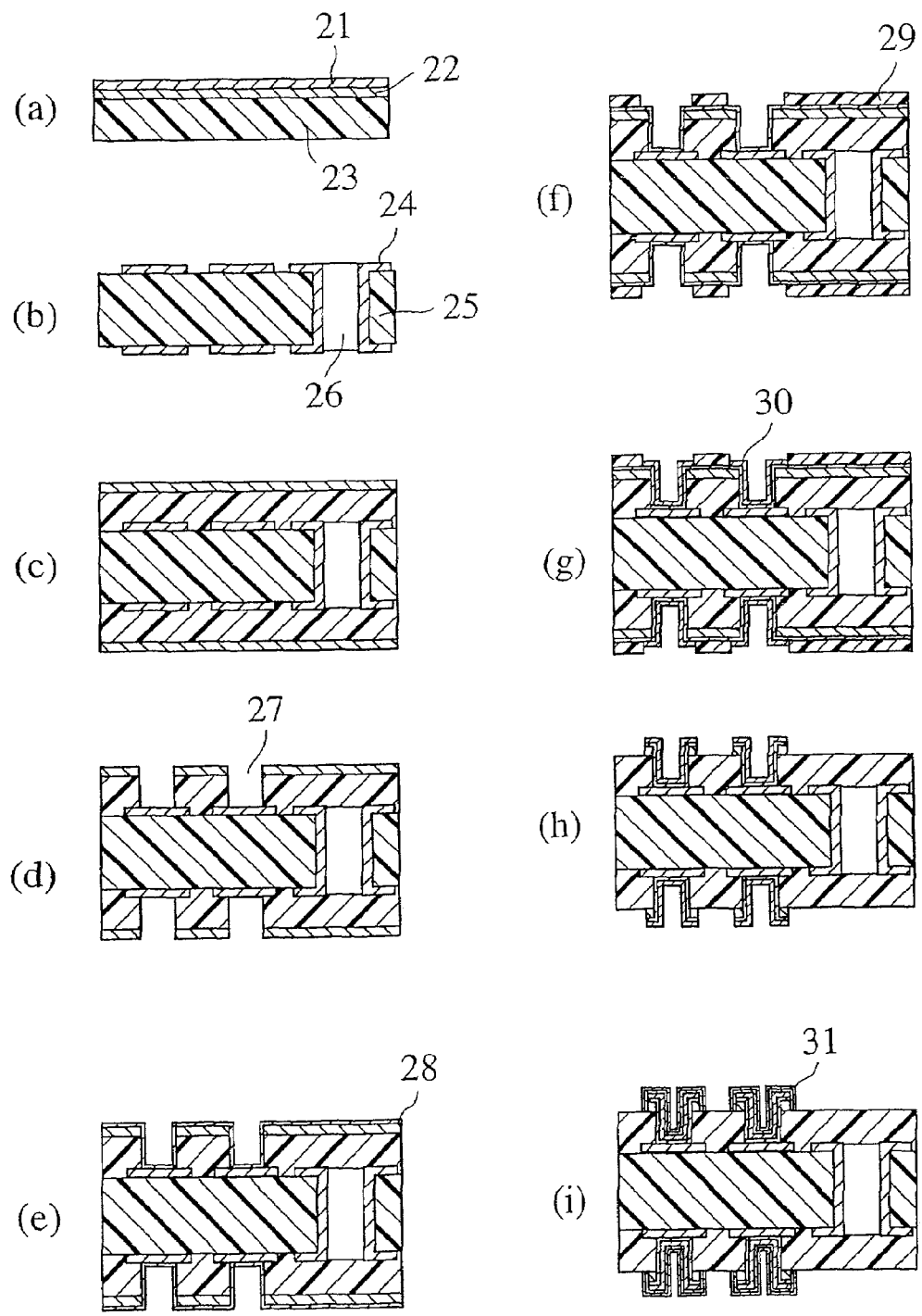
FIG. 3 is a sectional view showing the method of manufacturing the board used for evaluation of EXAMPLE 16 to EXAMPLE 30.

The resin composition 1 was applied on the surface of the metal foil 1 with the roller coater so that the post-drying thickness became 50 μm, and the resin coated metal foil with the carrier was obtained as shown in FIG. 3(*a*).

On the other hand, as shown in FIG. 3(*b*), MCL-E-679 (trade name, product of Hitachi Chemical Co., Ltd.) which is a glass cloth base material epoxy copper clad laminate with a thickness of 0.2 mm having the metal foil with a thickness of 18 μm on both the surfaces was used as the insulating base material, the metal foil of the unnecessary portions was removed by the etching, a through hole 26 was made, an internal layer conductor circuit 24 was formed, and an internal circuit plate 25 was formed.

The copper surface was roughened to form an irregularity having the roughness of about 3 μm by performing spraying treatment to the internal layer conductor circuit 24 of the internal circuit plate 25 with MEC etch BOND CZ-8100 (trade name, product of MEC CO., LTD.) on the conditions that the solution temperature was 35° C. and spray pressure was 0.15 MP. Then, the substrate was dipped into MEC etch BOND CL-8300 (trade name, product of MEC CO., LTD.) on the condition that the solution temperature was 25° C. and dipping time was 20 seconds to perform the anti-corrosive treatment to the copper surface.

As shown in FIG. 3(*c*), after the resin coated metal foil with the carrier which had been produced in FIG. 3(*a*) was heated and pressurize-laminated for 60 minutes on the conditions of 170° C. and 30 kgf/cm$^2$, the copper foil of the carrier was peeled.

As shown in FIG. 3(*d*), an interstitial via hole 27 having the diameter of 80 μm was made from above the copper foil with the carbon dioxide gas impact laser punching machine L-500 (product name, Sumitomo Heavy Industries, Ltd.), and the smear was removed by dipping the substrate into the mixed aqueous solution of potassium permanganate of 65 g/L and sodium hydroxide of 40 g/L at the solution temperature of 70° C. for 20 minutes.

Then, after the copper clad laminate was dipped into HS-202B (trade name, product of Hitachi Chemical Co., Ltd.) which is a palladium solution at 25° C. for 15 minutes and the catalyst was given, the electroless copper plating was performed with CUST-201 (trade name, product of Hitachi Chemical Co., Ltd.) on the conditions of the solution temperature of 25° C. for 30 minutes to form an electroless copper plating layer 28 having the thickness of 0.3 μm as shown in FIG. 3(*e*).

As shown in FIG. 3(*f*), RY-3025 (trade name, product of Hitachi Chemical Co., Ltd.) which is a dry film photoresist was laminated on the surface of the electroless plating layer 28, and RY-3025 was exposed with ultraviolet ray through a photomask which masks the portions where the electrolytic copper plating is performed. Then development was performed to form a plating resist 29.

As shown in FIG. 3(*g*), the electrolytic copper plating was performed up to 20 μm with the copper sulfate bath on the conditions that the solution temperature was 25° C. and the current density was 1.0 A/dm$^2$, and a pattern electrolytic copper plating 30 was formed so that the minimum circuit conductor width/circuit conductor interval (L/S) became 25/15 μm.

Then, as shown in FIG. 3(*h*), after the dry film was removed with HTO (trade name, product of Nichigo-Morton Co., Ltd.) which is a resist stripping solution, the copper except for the copper located on the pattern portions was removed by the etching with the etchant having the composition of $H_2SO_4$ 20 g/L and $H_2O_2$ 10 g/L. At the time of etching, after the substrate was cut into small pieces whose surface area of one side was 1 dm$^2$, the small pieces are put into the 1 L beaker and etching was performed with the magnetic stirrer at 40° C. for 5 minutes.

Finally, a gold plating 31 was performed to the conductor circuit on the conditions shown in TABLE 1 (FIG. 3(*i*)). The minimum circuit conductor width/circuit conductor interval (L/S) was 20/20 μm.

EXAMPLE 17

The substrate was produced in a manner similar to EXAMPLE 16 except that the resin composition 1 was applied to the surface of the metal foil 2 to produce the resin coated metal foil with the carrier.

EXAMPLE 18

The substrate was produced in a manner similar to EXAMPLE 16 except that the resin composition 2 was applied to the surface of the metal foil 2 to produce the resin coated metal foil with the carrier.

EXAMPLE 19

The substrate was produced in a manner similar to EXAMPLE 16 except that the resin composition 2 was applied to the surface of the metal foil 4 to produce the resin coated metal foil with the carrier.

EXAMPLE 20

The substrate was produced in a manner similar to EXAMPLE 16 except that the resin composition 3 was applied to the surface of the metal foil 1 to produce the resin coated metal foil with the carrier.

EXAMPLE 21

The substrate was produced in a manner similar to EXAMPLE 16 except that the resin composition 3 was applied to the surface of the metal foil 2 to produce the resin coated metal foil with the carrier.

EXAMPLE 22

The substrate was produced in a manner similar to EXAMPLE 16 except that the resin composition 3 was applied to the surface of the metal foil 3 to produce the resin coated metal foil with the carrier.

EXAMPLE 23

The substrate was produced in a manner similar to EXAMPLE 16 except that the resin composition 3 was applied to the surface of the metal foil 4 to produce the resin coated metal foil with the carrier.

EXAMPLE 24

The substrate was produced in a manner similar to EXAMPLE 16 except that the resin composition 1 was applied to the surface of the metal foil 3 to produce the resin coated metal foil with the carrier.

EXAMPLE 25

The substrate was produced in a manner similar to EXAMPLE 16 except that the resin composition 1 was applied to the surface of the metal foil 4 to produce the resin coated metal foil with the carrier.

EXAMPLE 26

The substrate was produced in a manner similar to EXAMPLE 16 except that the resin composition 2 was applied to the surface of the metal foil 1 to produce the resin coated metal foil with the carrier.

EXAMPLE 27

The substrate was produced in a manner similar to EXAMPLE 16 except that the resin composition 2 was applied to the surface of the metal foil 3 to produce the resin coated metal foil with the carrier.

EXAMPLE 28

The substrate was produced in a manner similar to EXAMPLE 16 except that the resin composition 3 was applied to the surface of the metal foil 5 to produce the resin coated metal foil with the carrier.

EXAMPLE 29

The substrate was produced in a manner similar to EXAMPLE 16 except that the resin composition 3 was applied to the surface of the metal foil 6 to produce the resin coated metal foil with the carrier.

EXAMPLE 30

The substrate was produced in a manner similar to EXAMPLE 16 except that the resin composition 3 was applied to the surface of the metal foil 7 to produce the resin coated metal foil with the carrier.

Measurement Conditions (1) Conductor Surface Roughness

The conductor surface roughness of the substrates obtained by EXAMPLE and COMPARATIVE EXAMPLE were measured pursuant to JIS-B-0601.

(2) Peel Strength

The peel strength of the conductor circuit in the substrates obtained by EXAMPLE and COMPARATIVE EXAMPLE was measured pursuant to JIS-C-6481 except that a peel width was set to 1 mm. Three times measurement was performed to each EXAMPLE and COMPARATIVE EXAMPLE. Namely, for each EXAMPLE and COMPARATIVE EXAMPLE, the first measurement was performed after the substrate was produced, the second measurement was performed after a 150° C. heating test, and the third measurement was performed after a PCT test. When the peel width is narrowed, water absorption degradation is easy to occur, and the peel strength tends to be weakened compared with the measurement in the width of 10 mm.

Sample for 150° C. Heating Test

The substrates obtained by EXAMPLE and COMPARATIVE EXAMPLE were left at 150° C. for 240 hours in vapor phase.

Pressure Cooker Test (PCT Test)

The substrates obtained by EXAMPLE and COMPARATIVE EXAMPLE were left for 72 hours on the conditions of a temperature of 121° C., a pressure of 2 atmospheres, and a humidity of 100%.

(3) Relative Dielectric Constant and Dielectric Loss Tangent

The cured materials of the insulating resin compositions 1 to 3 were produced to evaluate the dielectric properties. A sample, in which the resin sides of the resin coated metal foil obtained in EXAMPLE 16, EXAMPLE 18 and EXAMPLE 20 were stacked and press-cured, and then the metal foil was etched, was used. The press conditions were as follows: a rate of temperature increase was 5° C./min, a curing temperature was 180° C., a curing time was 90 min, and a pressure was 2.0 MPa. The relative dielectric constant and the dielectric loss tangent of the obtained resin cured material were measured at 1 GHz with an impedance-material analyzer HP4291B (product of Hewlett-Packard Development Company, LP).

(4) Conductor Top Width and Space Width

The circuit conductor width/circuit conductor interval (L/S) after circuit formation of each substrate obtained by EXAMPLE and COMPARATIVE EXAMPLE was photographed from above the substrate with an optical microscope, and 20 points in the photograph were arbitrarily measured and an average was calculated on the basis of data in which image processing was performed.

(Result)

TABLE 2 shows the results of the conductor surface roughness, the relative dielectric constant, the dielectric loss tangent, the peel strength, the conductor top width, and space width of the substrates obtained by EXAMPLE 1 to EXAMPLE 15 and COMPARATIVE EXAMPLE 1. Similarly, TABLE 3 shows the results of the conductor surface roughness, the relative dielectric constant, the dielectric loss tangent, the peel strength, the conductor top width, and space width of the substrates obtained by EXAMPLE 16 to EXAMPLE 30.

TABLE 2

| Sample | Anti-corrosive treatment | Chromate treatment | Coupling agent | Resin | 1 GHz relative dielectric constant (prepreg) | 1 GHz dielectric loss tangent (prepreg) | Peel strength (kN/m) Initial | Peel strength (kN/m) Post-heating | Peel strength (kN/m) Post-PCT | Copper foil surface roughness Rz(μm) | Conductor surface roughness Rz(μm) | Conductor top width Rz(μm) | Space width Rz(μm) |
|---|---|---|---|---|---|---|---|---|---|---|---|---|---|
| EXAMPLE 1 | Zinc | Done | Amines | Resin composition 1 | 3.7 | 0.028 | 1.02 | 1.10 | 1.10 | 0.5 | 0.7 | 20 | 20 |
| EXAMPLE 2 | Nickel | Done | Amines | Resin composition 1 | 3.7 | 0.028 | 1.01 | 1.13 | 1.12 | 0.6 | 0.7 | 20 | 20 |
| EXAMPLE 3 | Nickel | Done | Amines | Resin composition 1 | 2.7 | 0.007 | 1.50 | 1.48 | 1.38 | 0.6 | 0.7 | 20 | 20 |
| EXAMPLE 4 | Nickel | Done | Epoxy | Resin composition 2 | 2.7 | 0.007 | 1.48 | 1.45 | 1.33 | 0.6 | 0.7 | 20 | 20 |
| EXAMPLE 5 | Zinc | Done | Amines | Resin composition 2 | 3.1 | 0.011 | 1.13 | 1.15 | 1.18 | 0.5 | 0.7 | 20 | 20 |
| EXAMPLE 6 | Nickel | Done | Amines | Resin composition 3 | 3.1 | 0.011 | 1.05 | 1.02 | 1.03 | 0.6 | 0.7 | 20 | 20 |
| EXAMPLE 7 | Zinc | Done | Epoxy | Resin composition 3 | 3.1 | 0.011 | 1.13 | 1.15 | 1.08 | 0.5 | 0.7 | 20 | 20 |
| EXAMPLE 8 | Nickel | Done | Epoxy | Resin composition 3 | 3.1 | 0.011 | 1.05 | 1.08 | 1.05 | 0.6 | 0.7 | 20 | 20 |
| EXAMPLE 9 | Zinc | Done | Epoxy | Resin composition 1 | 3.7 | 0.028 | 0.70 | 0.23 | 0.23 | 0.5 | 0.7 | 20 | 20 |
| EXAMPLE 10 | Nickel | Done | Epoxy | Resin composition 1 | 3.7 | 0.028 | 0.78 | 0.25 | 0.31 | 0.6 | 0.7 | 20 | 20 |
| EXAMPLE 11 | Zinc | Done | Amines | Resin composition 2 | 2.7 | 0.007 | 1.40 | 0.99 | 0 (Peeled) | 0.5 | 0.7 | 20 | 20 |
| EXAMPLE 12 | Zinc | Done | Epoxy | Resin composition 2 | 2.7 | 0.007 | 1.35 | 0.95 | 0 (Peeled) | 0.5 | 0.7 | 20 | 20 |
| EXAMPLE 13 | Zinc | Nothing | Amines | Resin composition 3 | 3.1 | 0.011 | 0.65 | 0.28 | 0.30 | 0.5 | 0.7 | 20 | 20 |
| EXAMPLE 14 | Zinc | Done | Nothing | Resin composition 3 | 3.1 | 0.011 | 0.61 | 0.25 | 0.20 | 0.5 | 0.7 | 20 | 20 |
| EXAMPLE 15 | No treatment | Done | Amines | Resin composition 3 | 3.1 | 0.011 | 0.28 | 0.23 | 0.21 | 0.6 | 0.7 | 20 | 20 |
| COMPARATIVE EXAMPLE 1 | Zinc | Done | Amines | Resin composition 1 | 3.7 | 0.028 | 1.01 | 1.15 | 1.18 | 2.7 | 2.5 | 10 | 30 |

TABLE 3

| Sample | Anti-corrosive treatment | Chromate treatment | Coupling agent | Resin | 1 GHz relative dielectric constant (prepreg) | 1 GHz dielectric loss tangent (prepreg) | Peel strength (kN/m) Initial | Peel strength (kN/m) Post-heating | Peel strength (kN/m) Post-PCT | Copper foil surface roughness Rz(μm) | Conductor surface roughness Rz(μm) | Conductor top width Rz(μm) | Space width Rz(μm) |
|---|---|---|---|---|---|---|---|---|---|---|---|---|---|
| EXAMPLE 16 | Zinc | Done | Amines | Resin composition 1 | 3.7 | 0.028 | 1.22 | 1.32 | 1.28 | 0.5 | 0.7 | 20 | 20 |
| EXAMPLE 17 | Nickel | Done | Amines | Resin composition 1 | 3.7 | 0.028 | 1.25 | 1.33 | 1.25 | 0.6 | 0.7 | 20 | 20 |
| EXAMPLE 18 | Nickel | Done | Amines | Resin composition 1 | 2.7 | 0.007 | 1.61 | 1.61 | 1.48 | 0.6 | 0.7 | 20 | 20 |
| EXAMPLE 19 | Nickel | Done | Epoxy | Resin composition 2 | 2.7 | 0.007 | 1.58 | 1.52 | 1.38 | 0.6 | 0.7 | 20 | 20 |
| EXAMPLE 20 | Zinc | Done | Amines | Resin composition 2 | 3.1 | 0.011 | 1.23 | 1.22 | 1.21 | 0.5 | 0.7 | 20 | 20 |
| EXAMPLE 21 | Nickel | Done | Amines | Resin composition 3 | 3.1 | 0.011 | 1.12 | 1.10 | 1.08 | 0.6 | 0.7 | 20 | 20 |
| EXAMPLE 22 | Zinc | Done | Epoxy | Resin composition 3 | 3.1 | 0.011 | 1.22 | 1.22 | 1.13 | 0.5 | 0.7 | 20 | 20 |
| EXAMPLE 23 | Nickel | Done | Epoxy | Resin composition 3 | 3.1 | 0.011 | 1.16 | 1.10 | 1.09 | 0.6 | 0.7 | 20 | 20 |
| EXAMPLE 24 | Zinc | Done | Epoxy | Resin composition 1 | 3.7 | 0.028 | 0.80 | 0.23 | 0.25 | 0.5 | 0.7 | 20 | 20 |
| EXAMPLE 25 | Nickel | Done | Epoxy | Resin composition 1 | 3.7 | 0.028 | 0.81 | 0.28 | 0.30 | 0.6 | 0.7 | 20 | 20 |
| EXAMPLE 26 | Zinc | Done | Amines | Resin composition 1 | 2.7 | 0.007 | 1.42 | 1.02 | 0 (Peeled) | 0.5 | 0.7 | 20 | 20 |
| EXAMPLE 27 | Zinc | Done | Epoxy | Resin composition 2 | 2.7 | 0.007 | 1.32 | 0.98 | 0 (Peeled) | 0.5 | 0.7 | 20 | 20 |
| EXAMPLE 28 | Zinc | Nothing | Amines | Resin composition 2 | 3.1 | 0.011 | 0.71 | 0.30 | 0.32 | 0.5 | 0.7 | 20 | 20 |
| EXAMPLE 29 | Zinc | Done | Nothing | Resin composition 3 | 3.1 | 0.011 | 0.60 | 0.22 | 0.21 | 0.5 | 0.7 | 20 | 20 |
| EXAMPLE 30 | No treatment | Done | Amines | Resin composition 3 | 3.1 | 0.011 | 0.30 | 0.22 | 0.22 | 0.6 | 0.7 | 20 | 20 |

Figure 4:
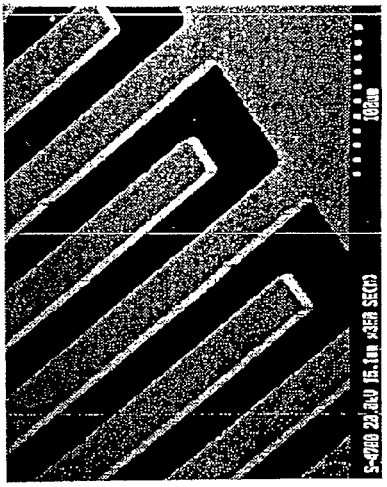
FIG. 4 is a photograph of a board circuit produced with a resin composition 1 of EXAMPLE.
Figure 4:
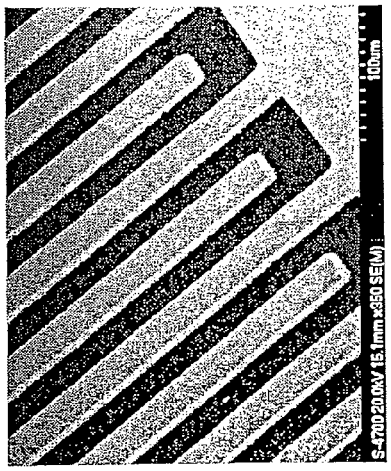
Figure 4:
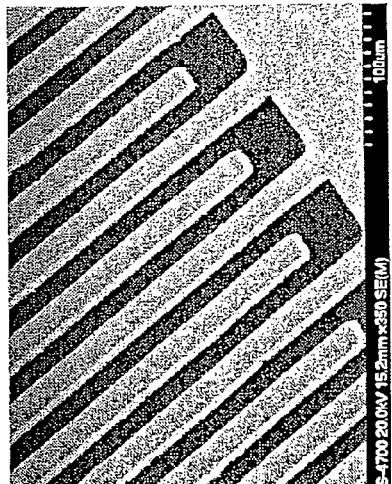
Figure 5:
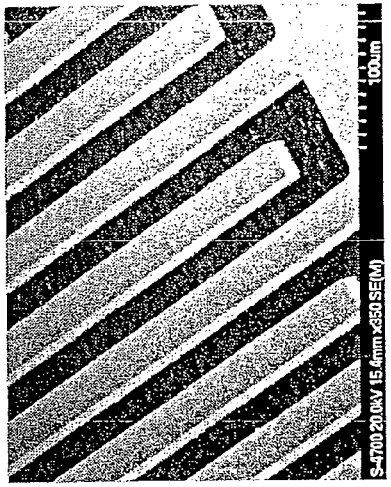
FIG. 5 is a photograph of a board circuit produced with a resin composition 2 of EXAMPLE.
Figure 5:
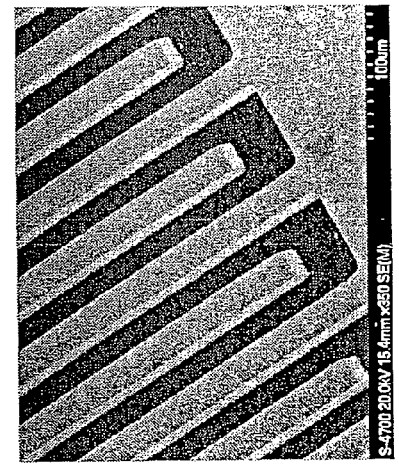
Figure 5:
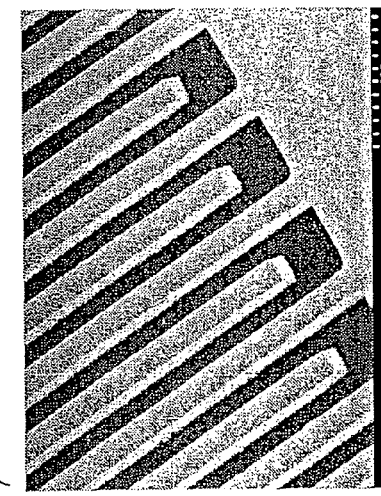
Figure 6:
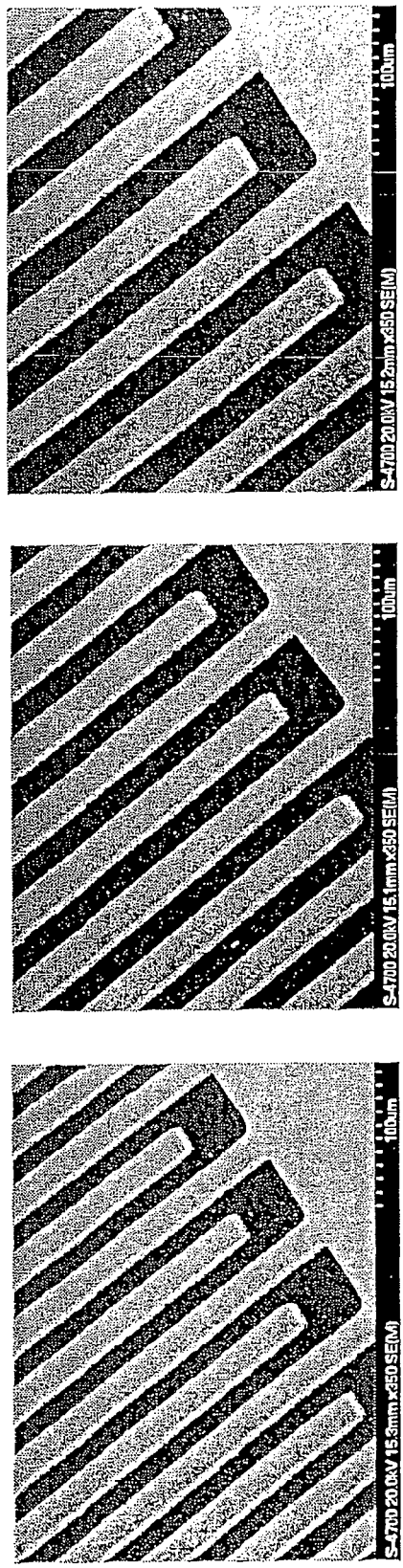
FIG. 6 is a photograph of a board circuit produced with a resin composition 3 of EXAMPLE.

From TABLE 2 and TABLE 3, it is understood that the substrates obtained by EXAMPLE 1 to EXAMPLE 30 have substantially the same conductor top width and space width and the good circuits were formed. FIGS. 4, 5, and 6 are SEM photographs showing the circuits of each substrate which was produced in a manner similar to EXAMPLE 1 with resin compositions 1, 2, and 3 of the examples respectively. It can be seen from FIGS. 4, 5, and 6 that the circuit formation is good in each of L/S=20/20 μm, 25/25 μm, and 30/30 μm. Particularly, the substrates produced by EXAMPLE 1 to 14 and 16 to 29 are excellent in the initial peel strength and the flatness. Further, EXAMPLE 1 to 8, 11, 12, 16 to 23, 26, and 27 are excellent in the post-heating peel strength, and EXAMPLE 1 to 8 and 16 to 23 are excellent in the post-water absorption peel strength. In EXAMPLE 3, 4, 11, 12, 18, 19, 26, and 27, the relative dielectric constant and the dielectric loss tangent are low and preferable to the applications in which the low-loss electric signal is required. Particularly EXAMPLE 3, 4, 18, and 19 are extremely excellent in the relative dielectric constant, the dielectric loss tangent, and the peel strength.

On the other hand, since the metal foil has the roughened layer in COMPARATIVE EXAMPLE 1, excessive etching is required, which results in the narrowed conductor top width. Further, since the conductor surface is rough, it is not preferable in the electric properties.

As described above, in accordance with the invention, it is possible to provide a metal clad laminate or a resin coated metal foil in which adhesion is compatible with the flatness at the interface between a insulating resin composition layer and metal foil, and practical factors such as the cost efficiency and the handling are also satisfied in manufacturing a printed wiring board. Further, it is possible to provide the printed wiring board and the manufacturing method thereof, in which the metal clad laminate or the resin coated metal foil is used, the reliability and circuit formability are high, and the conductor loss is extremely low.

It is further understood by those skilled in the art that the foregoing description is a preferred embodiment of the invention and that various changes and modifications may be made without departing from the spirit and scope of the invention.

What is claimed is:

1. Resin coated metal foil including an insulating resin composition layer, of an insulating resin composition, and metal foil fixed to a single surface or both surfaces of said insulating resin composition layer, wherein:

said insulating resin composition layer contains epoxy resin which is liquid at room temperature and a latent curing agent, surface treatment which is an anti-corrosive treatment, a chromate treatment and a silane coupling treatment performed with silane coupling agent containing amino functional silane is performed to at least an insulating resin composition layer side of said metal foil, surface roughness (Rz) of said metal foil is not more than 2.0 μm in both the surfaces, roughening treatment is not substantially performed to both the surfaces of said metal foil, and a thickness of said metal foil is not more than 3 μm.

2. The resin coated metal foil according to claim 1, characterized in that said anti-corrosive treatment is performed with any one selected from the group consisting of nickel, tin, zinc, molybdenum, and cobalt, and alloys thereof.

3. The resin coated metal foil according to claim 1, characterized in that said chromate treatment is performed on said anti-corrosive treatment.

4. The resin coated metal foil according to claim 1, characterized in that said silane coupling treatment is performed after said anti-corrosive treatment and said chromate treatment are performed, respectively.

5. The resin coated metal foil according to claim 1, characterized in that a silane coupling treatment agent used for said silane coupling treatment chemically reacts with said insulating resin composition by heating.

6. The resin coated metal foil according to claim 1, characterized in that, after curing the insulating resin composition, a relative dielectric constant is not more than 3.0 at 1 GHz or a dielectric loss tangent is not more than 0.01 at 1 GHz.

7. A printed wiring board characterized by being manufactured with the resin coated metal foil according to claim 1.

8. The printed wiring board according to claim 7, characterized in that peel strength between said insulating resin composition layer and a conductor circuit having a width of 1 mm is not lower than 0.6 kN/m.

9. A metal clad laminate including an insulating resin composition layer, of an insulating resin composition, and metal foil fixed to a single surface or both surfaces of said insulating resin composition layer, wherein:

said insulating resin composition layer contains epoxy resin which is liquid at room temperature and a latent curing agent, surface treatment which is an anti-corrosive treatment, a chromate treatment and a silane coupling treatment performed with silane coupling agent containing amino functional silane is performed to at least an insulating resin composition layer side of said metal foil, surface roughness (Rz) of said metal foil is not more than 2.0 μm in both the surfaces, roughening treatment is not substantially performed to both the surfaces of said metal foil, and a thickness of said metal foil is not more than 3 μm.

10. The metal clad laminate according to claim 9, characterized in that said anti-corrosive treatment is performed with any one selected from the group consisting of nickel, tin, zinc, molybdenum, and cobalt, and alloys thereof.

11. A printed wiring board characterized by being manufactured with the metal clad laminate according to claim 9.

12. The printed wiring board according to claim 11, characterized in that peel strength between said insulating resin composition layer and a conductor circuit having a width of 1 mm is not lower than 0.6 kN/m.

* * * * *